(12) United States Patent
Mei et al.

(10) Patent No.: US 12,185,609 B2
(45) Date of Patent: Dec. 31, 2024

(54) DISPLAY SUBSTRATE, METHOD FOR MANUFACTURING THE SAME, AND DISPLAY PANEL

(71) Applicants: Beijing BOE Technology Development Co., Ltd., Beijing (CN); BOE TECHNOLOGY GROUP CO., LTD., Beijing (CN)

(72) Inventors: Wenhai Mei, Beijing (CN); Zhuo Li, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 430 days.

(21) Appl. No.: 17/539,492

(22) Filed: Dec. 1, 2021

(65) Prior Publication Data
US 2022/0238605 A1  Jul. 28, 2022

(30) Foreign Application Priority Data
Jan. 28, 2021  (CN) .......................... 202110122171.1

(51) Int. Cl.
*H01L 27/32*  (2006.01)
*H10K 59/35*  (2023.01)
(Continued)

(52) U.S. Cl.
CPC ............. *H10K 59/38* (2023.02); *H10K 59/35* (2023.02); *H10K 71/00* (2023.02); *H10K 2102/331* (2023.02)

(58) Field of Classification Search
CPC ........ H10K 59/38; H10K 59/35; H10K 71/00; H10K 2102/331; H10K 71/40;
(Continued)

(56) References Cited

U.S. PATENT DOCUMENTS

2021/0151526 A1* 5/2021 Jia ......................... H10K 59/12

FOREIGN PATENT DOCUMENTS

| CN | 107151483 A | 9/2017 |
|----|-------------|--------|
| CN | 108258154 A | 7/2018 |

(Continued)

OTHER PUBLICATIONS

China Patent Office, First Office Action dated Dec. 26, 2022, for corresponding Chinese application 202110122171.1.

*Primary Examiner* — Mohammed R Alam
(74) *Attorney, Agent, or Firm* — HOUTTEMAN LAW LLC

(57) ABSTRACT

A display substrate, a display panel and a method for manufacturing the display substrate are provided. The display substrate comprises a backing substrate and a plurality of pixel areas formed on the backing substrate, wherein the display substrate further comprises a quantum dot layer, the quantum dot layer comprises a plurality of quantum dot units located in the plurality of pixel areas respectively, wherein the quantum dot units comprise a matrix layer and quantum dots dispersed in the matrix layer, the matrix layer comprises a central region and a peripheral region disposed around the central region, the peripheral region comprises a polymer of photocurable monomers, and the central region comprises unpolymerized photocurable monomers.

20 Claims, 7 Drawing Sheets

(51) Int. Cl.
*H10K 59/38* (2023.01)
*H10K 71/00* (2023.01)
*H10K 102/00* (2023.01)

(58) Field of Classification Search
CPC .... H10K 50/115; H10K 71/135; C09D 11/30; C09D 11/101; C09D 11/50
See application file for complete search history.

(56) References Cited

FOREIGN PATENT DOCUMENTS

| | | |
|---|---|---|
| CN | 109354924 A | 2/2019 |
| CN | 110165055 A | 8/2019 |
| CN | 110591447 A | 12/2019 |
| CN | 111883688 A | 11/2020 |

* cited by examiner

DISPLAY SUBSTRATE, METHOD FOR MANUFACTURING THE SAME, AND DISPLAY PANEL

TECHNICAL FIELD

The present disclosure relates to the field of display devices, and in particular, to a display substrate including quantum dots, a method for manufacturing the display substrate, and a display panel including the display substrate.

BACKGROUND

Quantum dots are semiconductor nanostructures that confine conduction band electrons, valence band holes, and excitons in three spatial directions. Similar to the conventional semiconductors, the light-emitting mechanism of quantum dots is as follows: carriers in materials reach an excited state after receiving external energy, and the energy is released in the process of the carriers returning to a ground state, wherein the energy is usually emitted in the form of light.

Devices comprising quantum dots have a high color gamut and have been widely used in display devices, and there is also a continuing pursuit in the art to improve the lifetime of display devices comprising quantum dot materials.

SUMMARY

According to an embodiment of the present disclosure, it is provided an ink for ink-jet printing, a quantum dot display substrate, a method for manufacturing the display substrate, and a display panel including the display substrate.

In accordance with an aspect of the present disclosure, a display substrate is disclosed. The display substrate comprises a backing substrate and a pixel opening defining layer formed on the backing substrate, the pixel opening defining layer comprises a plurality of pixel openings, wherein the display substrate further comprises a quantum dot layer comprising a plurality of quantum dot units, the plurality of quantum dot units are located in the plurality of pixel openings respectively, wherein the quantum dot units comprise a matrix layer and quantum dots dispersed in the matrix layer, and the matrix layer comprises a central region and a peripheral region disposed around the central region, the peripheral region comprises a polymer of photocurable monomers, and the central region comprises unpolymerized photocurable monomers.

Optionally, the matrix layer is formed of curable monomers.

Optionally, the quantum dot units are formed by curing a curable ink comprising the curable monomers and the quantum dots.

Optionally, the quantum dot units are formed by curing a curable ink comprising the curable monomers and the quantum dots.

Optionally, a mass ratio of the polymer of photocurable monomers to the unpolymerized photocurable monomers in the peripheral region is greater than a mass ratio of the polymer of photocurable monomers to the unpolymerized photocurable monomer in the central region.

Optionally, the quantum dot layer is used as a color conversion layer, the plurality of pixel openings are divided into a plurality of pixel unit groups, each pixel unit group comprises a plurality of the pixel openings, and the quantum dot units corresponding to the same pixel unit group have different light emission colors.

Optionally, the mass ratio of the polymer of photocurable monomers in the central region to the unpolymerized photocurable monomers in the central region is less than or equal to 1:10.

Optionally, the display substrate further comprises a first electrode layer and a second electrode layer, the quantum dot units are located between the first electrode layer and the second electrode layer, the first electrode layer comprises a plurality of first electrodes corresponding one-to-one to the plurality of pixel openings, the first electrode layer is located between the backing substrate and the pixel opening defining layer, and the second electrode layer is located on a side of the quantum dot layer away from the backing substrate.

Optionally, the curable ink further comprises a solvent.

Optionally, the curable ink comprises substantially 2% to 30% by mass of the quantum dots.

Optionally, the curable ink comprises substantially 5% to 50% by mass of the photocurable monomers.

Optionally, each of the photocurable monomers is selected from a group consisting of a radical-polymerizable photocurable monomer and a cationic-polymerizable photocurable monomer.

Optionally, each of the photocurable monomers is selected from at least one of epoxy acrylic acid, methacrylate, ethyl acrylamide, and ethyl ether acrylate.

Optionally, the curable ink further comprises a photoinitiator, and the photoinitiator is an aromatic ketone based photoinitiator.

Optionally, each of the photocurable monomers is selected from at least one of a monomer having an epoxy group, a monomer having a vinyl ether group, a lactone-based monomer, an acetal-based monomer, and a cyclic ether-based monomer, and the ink further comprises a photoinitiator selected from at least one of a diazonium salt, a diaryliodonium salt, and a triarylsulfonium salt.

Optionally, the quantum dot layer is a color conversion layer, and in the curable ink, the quantum dots account for substantially 2% to 30% by mass of total amount of the curable ink, and the photocurable monomers account for substantially 5% to 50% by mass of total amount of the curable ink.

Optionally, the quantum dot layer is a light-emitting layer of quantum dot light-emitting diodes, and in the curable ink, the quantum dots account for substantially 2% to 15% by mass of total amount of the curable ink, and the photocurable monomers account for substantially 5% to 30% by mass of total amount of the curable ink.

In accordance with a second aspect of the present disclosure, a display panel comprising any of the above described display substrate is disclosed.

Optionally, the display substrate is a color film substrate, the display panel further comprises an array substrate having light-emitting diodes, the array substrate is disposed opposite to the display substrate as the color film substrate, and a liquid crystal layer is disposed between the array substrate and the display substrate.

Optionally, the display substrate is a quantum dot light-emitting diode display substrate and the display substrate further comprises an encapsulation layer disposed on the quantum dot light-emitting diode display substrate.

In accordance with a third aspect of the present disclosure, a method for manufacturing a display substrate is disclosed. The manufacturing method comprises steps of:

providing an initial substrate having a pixel opening defining layer formed thereon, the pixel opening defining layer defines a plurality of pixel openings, and the pixel openings comprise a central region and a peripheral region disposed around the central region; and performing at least one step of forming a final quantum dot layer, wherein the step of forming the final quantum dot layer comprises:

printing an ink into the pixel openings by ink-jet printing to form an initial quantum dot layer, wherein the ink comprises: a solvent; and quantum dots and photocurable monomers dispersed in the solvent;

irradiating the ink in the peripheral region of at least one pixel opening to polymerize the photocurable monomers of the ink in the peripheral region of the at least one pixel opening; and fixing the irradiated initial quantum dot layer to obtain the final quantum dot layer.

Optionally, the final quantum dot layer is a color conversion layer, and in the ink printed into the pixel openings, the quantum dots account for substantially 2% to 30% by mass of the ink, and the photocurable monomers account for substantially 5% to 50% by mass of the ink.

Optionally, the final quantum dot layer is a light-emitting layer of quantum dot light-emitting diodes, and in the ink printed into the pixel openings, the quantum dots account for substantially 2% to 15% by mass of the ink, and photocurable monomers account for substantially 5% to 30% by mass of the ink, and the step of providing the initial substrate comprises:
providing a backing substrate;
forming a first electrode layer, wherein the first electrode layer comprises a plurality of first electrodes corresponding one-to-one to the plurality of pixel openings; and
forming the pixel opening defining layer.

Optionally, the step of fixing the irradiated initial quantum dot layer comprises:

disposing the initial substrate upon subjecting to the irradiating in a vacuum chamber, and performing a vacuumizing operation; and performing an annealing treatment on the initial substrate upon subjecting to the vacuumizing operation to obtain the final quantum dot layer.

After the ink is printed into the pixel opening by ink-jet printing according to the manufacturing method, irradiation is performed on the peripheral region of the ink droplet in the pixel opening, such that the photocurable monomers in the peripheral region of the ink droplet is polymerized to form a polymer with higher viscosity. After the polymer is formed, the viscosity gradually increases from the central region of the ink droplet to the peripheral region of the ink droplet. Due to the Marangoni effect, the liquid in the center of the ink droplet flows to the peripheral region of the ink droplet with higher viscosity. However, the flow resistance is large, so that it can inhibit the liquid in the ink droplet from gathering in the peripheral region of the pixel opening, thereby avoiding the coffee ring effect, and finally providing quantum dots with uniform thickness. Thus, the display substrate of the quantum dot layer formed by ink printing having the improved lifetime can be provided.

BRIEF DESCRIPTION OF DRAWINGS

The accompanying drawings, which constitute a part of the description, are included to provide a further understanding of the present disclosure and are incorporated to illustrate the present disclosure together with the following embodiments, and are not to be considered as limiting the present disclosure. In the drawings.

DETAIL DESCRIPTION OF EMBODIMENTS

In order to make the technical solutions of the present disclosure better understood, the present disclosure is further described in detail with reference to the accompanying drawings and specific embodiments below.

It can be understood that the specific embodiments and accompanying drawings described herein are merely illustrative of the present disclosure and are not to be considered as limiting.

It can be understood that the various embodiments and features of the embodiments may be combined with each other in the case of no conflict.

It can be understood that, for the convenience of description, only the parts related to the present disclosure are shown in the accompanying drawings, and the parts irrelevant to the present disclosure are not shown in the accompanying drawings.

Definition

In the present disclosure, unless otherwise specified, the following technical terms should be understood according to the following explanations:

A to B, which is a range of values that includes the value of A, the value of B, and any value greater than A and less than B.

The mass percentage of A in B means A is a part of B, and the percentage of A by mass when the total mass of B (including the mass of A) is 100%.

In the related art, the quantum dot material may be used in a color conversion layer in a color film substrate, and may also be used in a light-emitting layer of quantum dot light-emitting diodes. In any application scenario, the quantum dot layer including the quantum dot materials is arranged in an array, and the ink-jet printing is usually used for forming the quantum dot layer arranged in an array.

Figure 1:
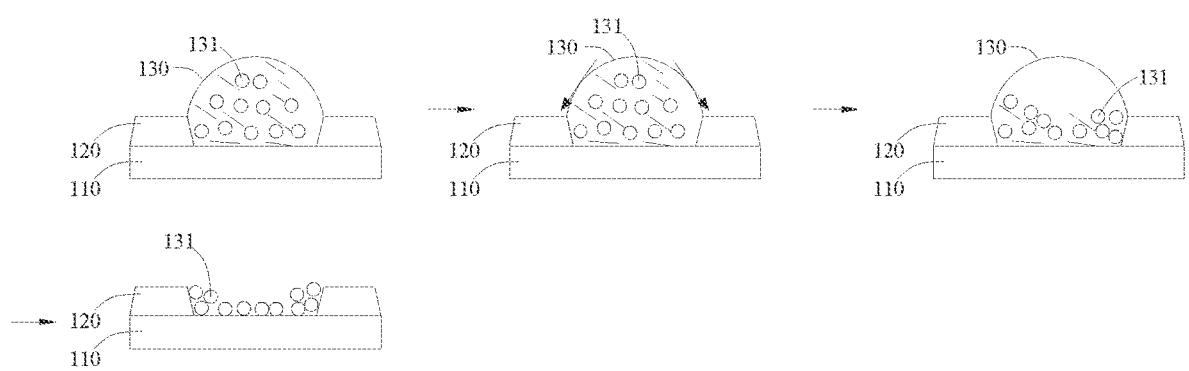
FIG. 1 is a schematic flowchart of forming a quantum dot layer by ink-jet printing in the related art.

The inventors of the present disclosure have studied to find the reasons that influence the lifetime of the display device including the quantum dot layer formed by ink-jet printing are as follows:

As shown in FIG. 1, the ink 130 for ink-jet printing includes a solvent, quantum dots 131 dispersed in the solvent, and quantum dot ligands dispersed in the solvent. When ink jet printing the ink into the pixel openings of the pixel opening defining layer 120 on the backing substrate 110, the droplet is in a convex shape. In the case of fixing the ink droplet, the substrate printed with the ink droplet needs to be placed into a vacuum chamber for vacuumizing so as to remove the solvent in the ink droplet. Since the solvent volatilization rate in the middle of the ink droplet is higher than that at the edge of the ink droplet, the Marangoni effect is caused. The part of the ink droplet, which is originally positioned in the center of the pixel opening, continuously flows to the edge of the pixel opening, and after film formation, the number of the quantum dots 131 in the peripheral region of the pixel opening is more than the number of the quantum dots 131 in the central region of the pixel opening, such that the quantum dot layer in the pixel opening is thin in the middle and thick at the edge (namely, the quantum dot layer generates a coffee ring effect), reducing the efficiency and lifetime of the device comprising the quantum dot layer.

In view of this, as one aspect of the present disclosure, a new manufacturing method of a display device is provided. Specifically, the manufacturing method of the display substrate comprises steps of:

providing an initial substrate, wherein at least one pixel area is formed on the initial substrate;

performing at least one step of forming a final quantum dot layer, wherein the step of forming the final quantum dot layer comprises:

printing an ink into the pixel area by ink jet printing to form an initial quantum dot layer, wherein the ink comprises a solvent, quantum dots dispersed in the solvent and photocurable monomers dispersed in the solvent;

irradiating the ink in the peripheral region of at least one pixel area to polymerize the photocurable monomers of the ink in the peripheral region of at least one pixel area; and fixing the irradiated initial quantum dot layer to obtain the final quantum dot layer.

The ink may comprise a solvent and a solute dispersed in the solvent. The solute includes quantum dots and photocurable monomers. Optionally, the solvent is an organic solvent.

Upon irradiating, the photocurable monomer polymerizes and cross-links. The polymer formed after the polymerization of the photocurable monomer has higher viscosity and poor flow property.

In a particular aspect, the pixel area may be formed with an opening defining layer defining a plurality of pixel openings. The pixel opening includes a central region and a peripheral region disposed around the central region, and thus, the step of forming the final quantum dot layer may include: printing the ink into the pixel openings to form the initial quantum dot layer; irradiating the ink in the peripheral region of at least one pixel opening to polymerize the photocurable monomers of the ink in the peripheral region of at least one pixel opening; and fixing the irradiated initial quantum dot layer to obtain the final quantum dot layer.

Figure 2:
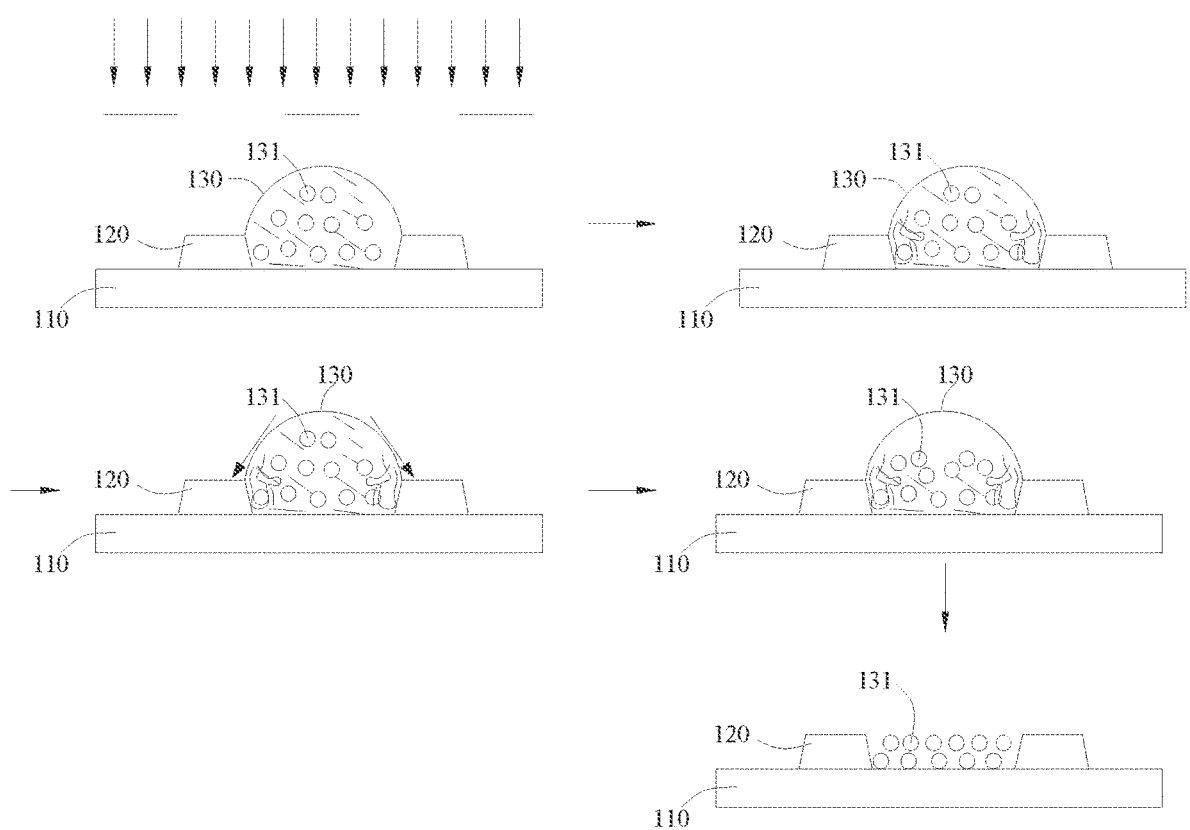
FIG. 2 is a schematic flowchart of forming the final quantum dot layer by ink-jet printing in the method of the present disclosure.

In the present disclosure, the ink may be used in the ink-jet printing process. Therefore, as shown in FIG. 2, after the ink is ink jet printed in the pixel opening of the display substrate, the peripheral region of the ink droplet in the pixel opening is irradiated, such that the photocurable monomers in the peripheral region of the ink droplet is polymerized to form a polymer with higher viscosity. After the polymer is formed, the viscosity gradually increases from the central region of the ink droplet to the peripheral region of the ink droplet. Due to the Marangoni effect, the liquid in the center of the ink droplet flows to the peripheral region of the ink droplet with higher viscosity. However, the flow resistance is large, so that it can inhibit the liquid in the ink droplet from gathering in the peripheral region of the pixel opening, thereby avoiding the coffee ring effect, and finally providing a quantum dot layer with uniform thickness.

In order to accelerate the polymerization of the photocurable monomers, the ink may optionally further include a photoinitiator. Under light irradiation, the photoinitiator can promote the polymerization of the photocurable monomers.

In the present disclosure, specific components of the ink are not particularly limited, and optionally, the ink comprises substantially 2% to 30% by mass of quantum dots.

Optionally, the ink comprises substantially 5% to 50% by mass of photocurable monomers.

The mass content of the quantum dots and the mass content of the photocurable monomers in the ink may be determined according to the specific use of the ink. When the ink is used for forming a color conversion layer in a color film substrate, the quantum dots account for substantially 2% to 30% by mass of the total amount of the ink, and the photocurable monomers account for substantially 5% to 50% by mass of the total amount of the ink. The quantum dots in the color conversion layer can convert light of one color to light of another color. For example, in an organic light-emitting diode display panel, when providing blue light-emitting diodes as the light-emitting diode in each pixel unit, the color film substrate comprises a color conversion layer that converts blue light into red light and a color conversion layer that converts blue light into green light.

When the ink is used for forming a light-emitting layer of quantum dot light-emitting diodes, the quantum dots account for substantially 2% to 15% by mass of the total amount of the ink, and the photocurable monomers account for substantially 5% to 30% by mass of the total amount of the ink in the ink printed into the pixel opening.

It is to be noted that, when the ink is used for forming the light-emitting layer of quantum dot light-emitting diodes, the content of the photocurable monomers is not suitable to exceed 30% by mass, so as not to affect the transmission rate of carrier in the quantum dot light-emitting diode when it emits light.

For a quantum dot light-emitting diode, the light-emitting mechanism of quantum dots in the light-emitting layer is similar to that of conventional semiconductors, both of which are: the carriers in materials reach an excited state after receiving external energy, and the energy is released in the process during which the carrier returns to a ground state, wherein the energy is usually emitted in the form of light.

In the present disclosure, the type of the photocurable monomer is not particularly limited, and optionally, the photocurable monomer is a photocurable monomer of a radical photopolymerization system (i.e., a radical-polymerizable photocurable monomer), and such a photocurable monomer is mainly based on unsaturated resin monomers. Alternatively, the radical-polymerizable photocurable monomer may include at least one of epoxy acrylic acid, methacrylate, ethyl acrylamide, and ethyl ether acrylate.

The radical-polymerizable photocurable monomers are characterized in low polymerization temperature, high reaction selectivity, easy to control and the like during polymerization. The radical-polymerizable photocurable monomer may contain more than two photochemically active functional groups. During polymerization, the monomer molecules directly absorb light with corresponding wavelength or are excited by energy transfer of the photoinitiator to induce chemical coupling reaction.

In order to accelerate the polymerization of the photopolymerizable monomers, the photoinitiator in the ink including radical-polymerizable photocurable monomers may optionally be an aromatic ketone photoinitiator (e.g., dibenyl ketone-based photoinitiator).

As another alternative embodiment, the photocurable monomer is a cationical-polymerizable photocurable monomer (i.e., a photocurable monomer of a cationical-photopolymerizable system). The cationical-polymerizable photocurable monomer may be polymerized by the action of a cationically active species which is capable of initiating the polymerization of monomers.

Alternatively, the cationical-polymerizable photocurable monomer includes at least one of a monomer having an epoxy group, a monomer having a vinyl ether group, a lactone-based monomer, an acetal-based monomer, and a cyclic ether-based monomer. The ink may also comprise a photoinitiator. Accordingly, the photoinitiator comprises at least one of a diazonium salt, a diaryliodonium salt, and a triarylsulfonium salt. The photoinitiator can generate an excited state under irradiating, decompose into cationic free radicals, and generate protons through hydrogen extraction reaction to initiate the polymerization of monomers.

In the present disclosure, the composition of the organic solvent is not particularly limited. For example, the organic solvent may be a mixture of ortho-dichlorobenzene and tetradecane. As an alternative embodiment, in the organic solvent, the volume ratio of ortho-dichlorobenzene to tetradecane is substantially 5:1 to 8:1.

In order to adjust the overall viscosity of the ink, an organic ligand may optionally be included in the ink. As an alternative embodiment, the organic ligand may be dodecanethiol, octanethiol, decanethiol, tetradecanethiol, hexadecanethiol, and/or octadecanethiol.

Figure 3:
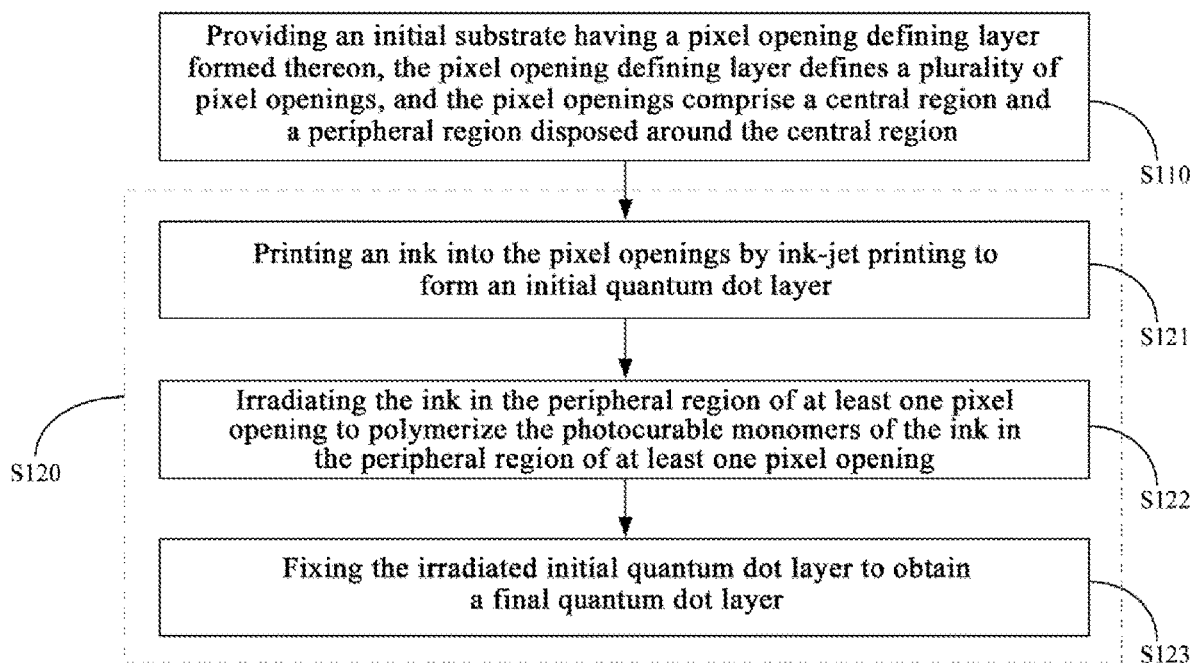
FIG. 3 is a flowchart of one embodiment of the manufacturing method provided by the present disclosure.

FIGS. 2 and 3 illustrate one embodiment of the method for manufacturing the display substrate of the present disclosure. As shown in FIGS. 2 and 3, the manufacturing method comprises steps S110 and S120.

In step S110, providing an initial substrate having a pixel opening defining layer formed thereon, the pixel opening defining layer defines a plurality of pixel openings, and the pixel openings comprises a central region and a peripheral region disposed around the central region.

The manufacturing method further comprises performing at least one step of forming a final quantum dot layer, which may be referred to as step S120 for convenience of description. In such embodiments, the step S120 comprises substeps S121, S122 and S123.

In step S121, printing an ink into the pixel openings by ink-jet printing to form an initial quantum dot layer, wherein the ink comprises a solvent and solutes dispersed in the solvent, the solutes comprise quantum dots and photocurable monomers;

In step S122, irradiating the ink in the peripheral region of at least one pixel opening to polymerize the photocurable monomers of the ink in the peripheral region of at least one pixel opening.

In step S123, fixing the irradiated initial quantum dot layer to obtain the final quantum dot layer.

In the manufacturing method provided by the present disclosure, by irradiating the ink in the peripheral region of at least one pixel opening in step S122, the photocurable monomers of the ink in the peripheral region of the irradiated pixel opening is polymerized, so that the ink viscosity is increased in the peripheral region of the pixel opening. As described above, due to the Marangoni effect, the liquid in the center of the ink droplet flows to the peripheral region of the ink droplet with higher viscosity. However, the flow resistance is large, so that it can inhibit the liquid in the ink droplet from gathering in the peripheral region of the pixel opening, thereby avoiding the coffee ring effect, and finally providing a quantum dot layer with uniform thickness.

In order to obtain a final quantum dot layer with uniform thickness in each pixel opening, optionally, in step S130, light irradiation is performed on the ink in the peripheral region of each pixel opening, such that the final quantum dot layer in each pixel opening can be ensured to have uniform thickness.

In the present disclosure, the width of the peripheral region is not particularly limited, and may be determined according to the specific material of the ink. For example, the peripheral region may have a width of substantially 1 to 30 microns.

In the present disclosure, the step of irradiating the ink in the peripheral region of at least one pixel opening includes irradiating only the ink in the peripheral region of the pixel opening through a mask. As another embodiment, the central region of the pixel opening may be shielded by the mask during light irradiation.

There is no particular limitation on how to implement step S122. As an alternative embodiment, irradiating only the ink in the peripheral region of the pixel opening may be achieved through a mask. A skilled person in the art will appreciate that when implementing light irradiation to the ink in the peripheral region of the pixel opening, small amounts of light may be directed to the central region due to diffraction, interference, the presence of stray light, etc., however, such small amounts of light do not affect the realization of the present objectives.

In the present disclosure, the fineness requirement for the edge of the exposure pattern is low (with high tolerance to diffraction and interference phenomena of light), as long as the ink in the peripheral region of the pixel opening can be irradiated. The light-transmitting area of the mask has a width in the order of several micrometers or even several tens of micrometers. For example, the width of the light-transmitting area may be substantially 1 to 30 micrometers.

In the present disclosure, because of the large width of the light-transmitting area and high tolerance to the diffraction and interference phenomena of light in the exposure process, the requirements are relatively low on the material and the process for manufacturing the mask and on the optical system (such as the light source and the lens) of the exposure process, thereby reducing the cost for manufacturing the mask.

The step of irradiating the ink in the peripheral region of at least one pixel opening comprises irradiating only the ink in the peripheral region of the pixel opening through a mask: alternatively comprises: irradiating both the peripheral region of the pixel opening, and the central region of the pixel opening, wherein the central region receives lower intensity of light irradiation than the peripheral region of the pixel opening, and the final quantum dot layers have also uniform thickness.

When the central region receives lower intensity of light irradiation than the peripheral region of the pixel opening, the viscosity of the ink droplet may gradually increase from the central region to the peripheral region of the ink droplet. Due to the Marangoni effect, the liquid in the center of the ink droplet flows to the peripheral region of the ink droplet with higher viscosity. However, the flow resistance is large, so that it can inhibit the liquid in the ink droplet from gathering in the peripheral region of the pixel opening, thereby avoiding the coffee ring effect, and finally providing a quantum dot layer with uniform thickness.

Optionally, the central region receives lower intensity of light irradiation than the peripheral region of the pixel opening which may be realized using a halftone mask.

In the present disclosure, the finally obtained display substrate is not particularly limited. As an embodiment, the display substrate may be a color film substrate for display panel, and in such embodiments, the quantum dot layer serves as a color conversion layer.

In this case, the display substrate includes final quantum dot layers corresponding to a variety of different colors. Step S120 may be performed for a plurality of times to achieve the manufacture of a color film substrate including quantum dot layers corresponding to a variety of different colors. For example, in the case of the display substrate includes a final quantum dot layer corresponding to red light (which can convert incident light into red light) and a final quantum dot layer corresponding to green light (which can convert incident light into green light), the step S120 may be performed twice in succession. By performing step S120 for the first time, the final quantum dot light-emitting layer corresponding to red light may be formed, and by performing step S120 for the second time, the final quantum dot light-emitting layer corresponding to green light may be formed.

Figure 4:
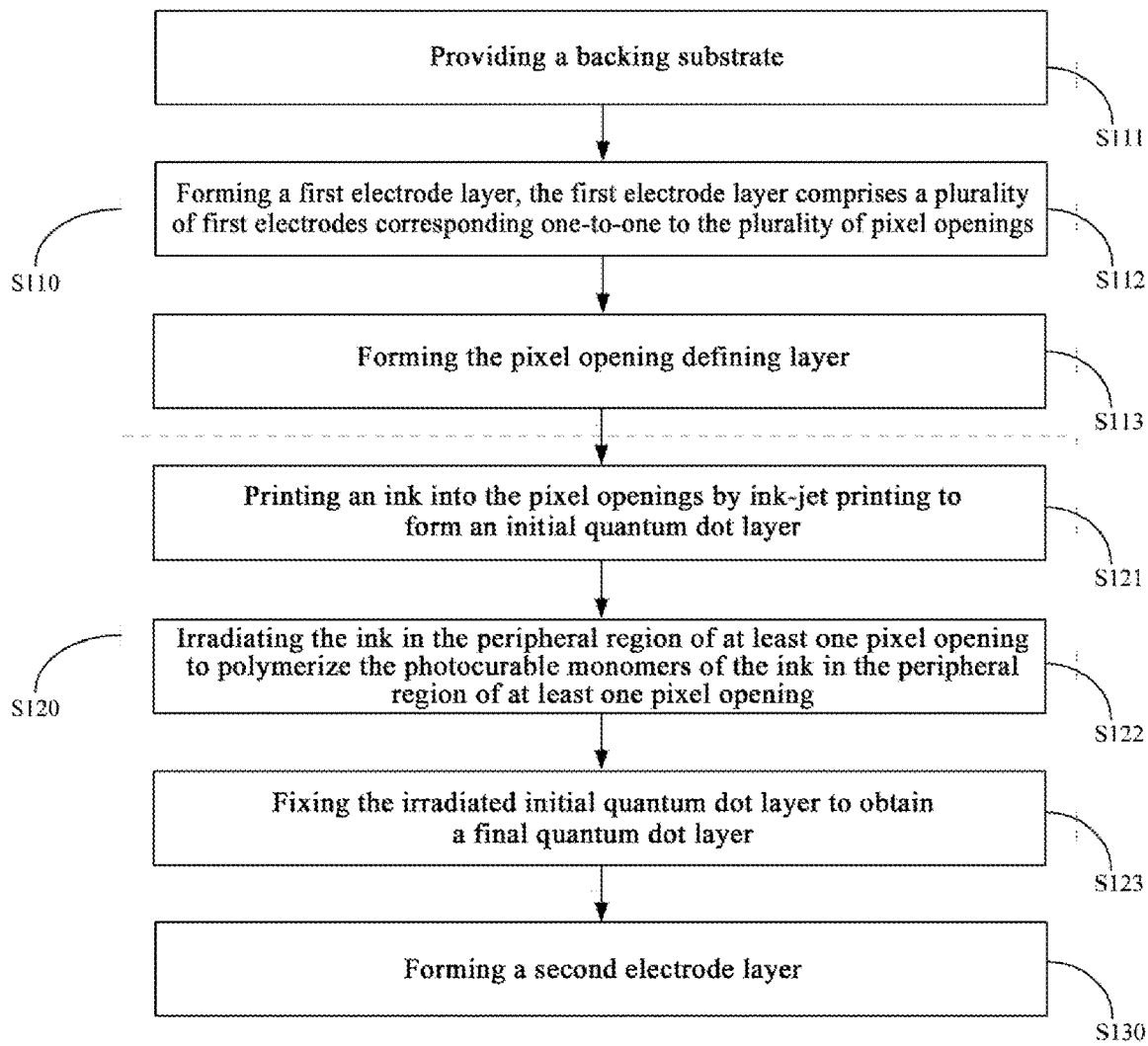
FIG. 4 is a flowchart of another embodiment of the manufacturing method provided by the present disclosure.

As another embodiment, the display substrate may be a substrate including a quantum dot light-emitting diode. Accordingly, as shown in FIG. 4, the step S110 of providing the backing substrate may comprise sub-steps S111, S112 and S113.

In step S111, a backing substrate is provided.

In step S112, a first electrode layer is formed, and the first electrode layer comprises a plurality of first electrodes. The plurality of first electrodes correspond one-to-one to the plurality of pixel openings.

In step S113, the pixel opening defining layer is formed.

Accordingly, the manufacturing method further comprises step S130, after performing all the step(s) S120.

In step S130, a second electrode layer is formed.

In such embodiments, the final quantum dot layer is a light-emitting layer of quantum dot light-emitting diodes. The display substrate includes a plurality of quantum dot light-emitting diodes capable of emitting light of a variety of different colors. The final quantum dot layers of the quantum dot light-emitting diodes emitting lights of different colors comprise different quantum dot materials. The final quantum dot layers of the quantum dot light-emitting diodes emitting lights of different colors may be manufactured by performing step S120 for a plurality of times. For example, in the case of the display substrate includes quantum dot light-emitting diodes that emitting red light, quantum dot light-emitting diodes that emitting green light, and quantum dot light-emitting diodes that emitting blue light, the step S120 may be performed three times in succession. After performing step S120 for the first time, the final quantum dot layer of quantum dot light-emitting diodes that emitting red light may be formed. After performing step S120 for the second time, the final quantum dot light-emitting layer of quantum dot light-emitting diodes that emitting green light may be formed. After performing step S120 for the third time, the final quantum dot light-emitting layer of quantum dot light-emitting diodes that emitting blue light may be formed.

Figure 5:
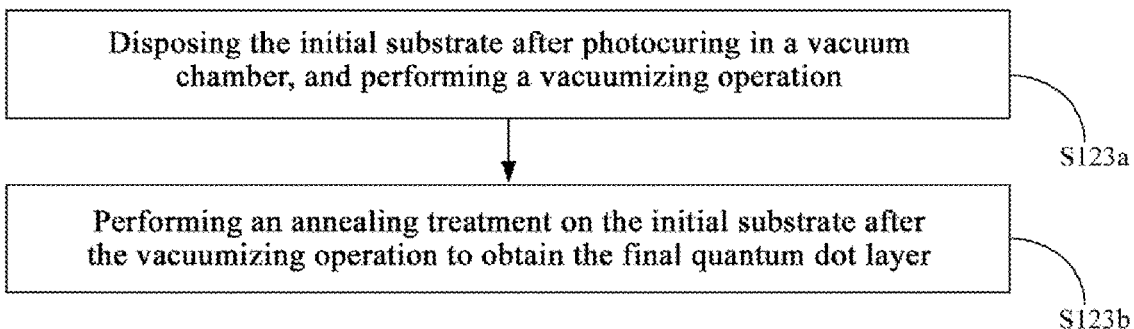
FIG. 5 is a flowchart of one embodiment of step S123 in the manufacturing method of FIG. 4.

In the present disclosure, there is no particular limitation on how to perform step S123, and optionally, as shown in FIG. 5, the step S123 may include sub-steps S123a and S123b.

In step S123a, the initial substrate after photocuring is disposed in a vacuum chamber and subjected to a vacuumizing operation;

In step S123b, the initial substrate after the vacuumizing operation is annealed to obtain the final quantum dot layer.

Through the vacuumizing operation in step S123a, the organic solvent in the ink may be removed, and the fixing of the film layer including the quantum dots may be achieved.

In the present disclosure, the duration of step S123a is not particularly limited. As an alternative embodiment, step S123a may continue for substantially 5 minutes to 15 minutes, and the vacuum degree in the vacuum chamber may be at least 10 mbar.

By the annealing treatment in step S123b, a final quantum dot layer with good stability can be obtained. In step S123a, the annealing temperature may be between substantially 100° C. and 200° C., and the annealing duration time may be substantially 15 minutes to 25 minutes.

As a second aspect of the present disclosure, it is provided a display substrate including a backing substrate and pixel areas formed on the backing substrate. The display substrate may further include a quantum dot layer including a plurality of quantum dot units, and the plurality of quantum dot units are located in the plurality of pixel areas respectively. The quantum dot unit may include a matrix layer and quantum dots dispersed in the matrix layer. The matrix layer includes a central region and a peripheral region disposed around the central region. The peripheral region includes a polymer of photocurable monomers, and the central region includes unpolymerized photocurable monomers.

In one embodiment, the mass ratio of the polymer of photocurable monomers to the unpolymerized photocurable monomers in the peripheral region is greater than the mass ratio of the polymer of photocurable monomers to the unpolymerized photocurable monomer in the central region.

In one embodiment, the central region comprises no or only a small amount of a polymer of curable monomers. This means that the mass ratio of the polymer of curable monomers in the central region to the unpolymerized photocurable monomers in the central region is less than or equal to 1:10. In some embodiments, the mass ratio of the polymer of curable monomers in the central region to the unpolymerized photocurable monomers in the central region is less than or equal to 1:100. In this case, it can be considered that the central region includes almost no polymer of curable monomers.

It will be appreciated that this is caused by irradiating the ink in the peripheral region while avoiding or reducing light irradiation in the central region. The photocurable monomers of the ink in the peripheral region is polymerized to generate a polymer of photocurable monomers, while the photocurable monomers in the central region is difficult to be polymerized due to lack of light irradiation or reduced light irradiation.

In a specific embodiment, the mass percent of the polymer of photocurable monomers is greater than the mass percent of unpolymerized photocurable monomers in the peripheral region, indicating that photocurable monomers in the peripheral region are effectively polymerized.

The pixel area may include a pixel opening defining layer including a plurality of pixel openings, and the plurality of quantum dot units are located in the plurality of pixel areas respectively.

Figure 6:
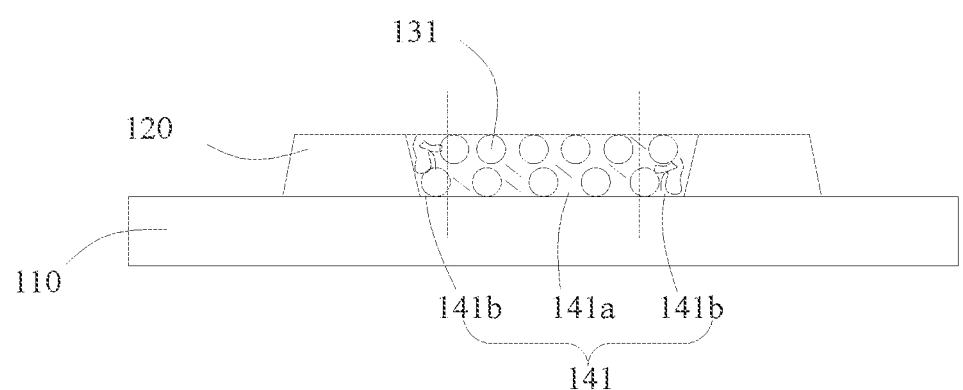
FIG. 6 is a partial structural view of the display substrate provided by the present disclosure.

In one embodiment, as shown in FIG. 6, the display substrate includes a backing substrate 110 and a pixel opening defining layer 120 formed on the backing substrate 110, the pixel opening defining layer 120 includes a plurality of pixel openings, wherein the display substrate further includes a quantum dot layer including a plurality of quantum dot units 140, the plurality of quantum dot units 140 are located in the plurality of pixel openings respectively, wherein the quantum dot unit 140 includes a matrix layer 141 and quantum dots 131 dispersed in the matrix layer 141, and the matrix layer 141 is formed of photocurable monomers. Specifically, the matrix layer 141 includes a central region 141a and a peripheral region 141b disposed around the central region 141a. The peripheral region 141b includes the polymer of photocurable monomers, and the central region includes photocurable monomers.

The display substrate provided by the present disclosure may be a display substrate manufactured by the manufacturing method provided by the first aspect of the present disclosure.

Figure 7:
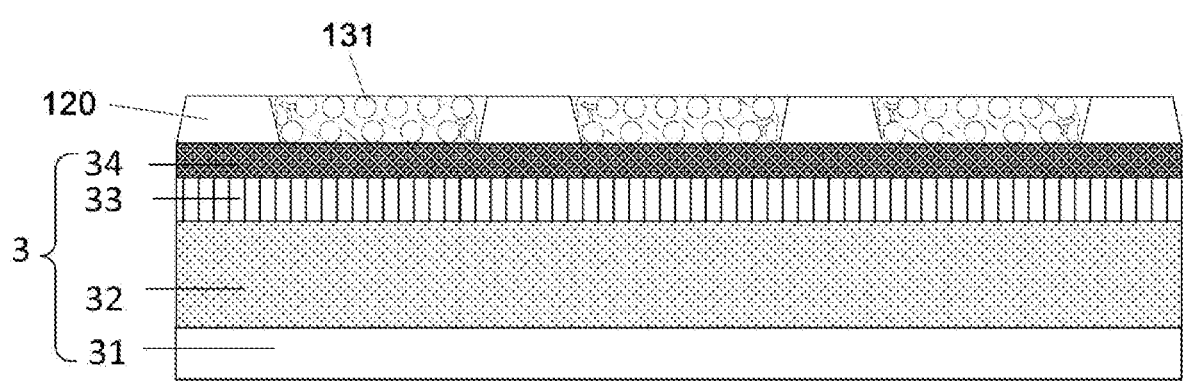
FIG. 7 is a partial structural view of the display panel according to an embodiment of the present disclosure.

The display substrate may be used as a color film substrate. The plurality of pixel openings are divided into a plurality of pixel unit groups, each pixel unit group comprises a plurality of pixel openings, and the quantum dot units corresponding to the same pixel unit group have different emission colors. As shown in FIG. 7, the display substrate according to this embodiment includes a backing substrate 34 and a plurality of pixel unit groups. Each pixel unit group includes a plurality of the pixel openings and a pixel defining layer 120. The same pixel unit group corresponds to a plurality of quantum dot units R1, G1 and B1 with different light emission colors. R1 corresponds to the quantum dot unit emitting red light, G1 corresponds to the quantum dot unit emitting green light, and B1 corresponds to the quantum dot unit emitting blue light.

In such embodiments, the quantum dot unit is used as a color conversion unit. The display substrate may be used in cooperation with the organic light-emitting diode array substrate 3, and the quantum dot light-emitting unit may perform color conversion on the light emitted from the organic light-emitting diode. For example, when providing blue light-emitting diodes as the organic light-emitting diode in each pixel unit, the color film substrate comprises a color conversion layer that converts blue light into red light and a color conversion layer that converts blue light into green light.

Figure 8:
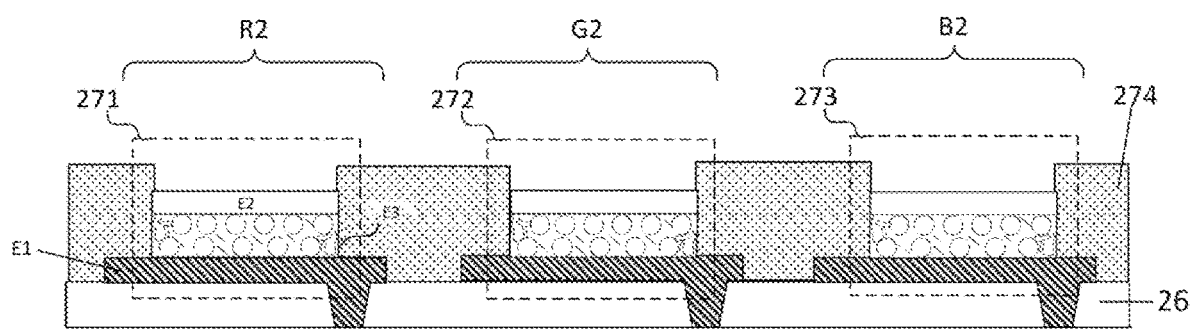
FIG. 8 is a partial structural view of the panel substrate according to another embodiment of the present disclosure.

The display substrate may also be a substrate comprising quantum dot light-emitting diodes. For example, as shown in FIG. 8, the display substrate further includes a first electrode layer and a second electrode layer. The first electrode layer includes a plurality of first electrodes E1. The plurality of first electrodes E1 correspond to the plurality of pixel openings 271, 272 and 273 one by one. The first electrode layer is located between the backing substrate 26 and the pixel opening defining layer 274, and the second electrode layer is located on a side of the quantum dot unit layer away from the backing substrate. The second electrode layer includes a plurality of second electrodes E2.

In such embodiments, the quantum dot light-emitting diodes in the display substrate are capable of emitting lights having a variety of different colors. As an alternative embodiment, the plurality of pixel openings are divided into a plurality of pixel groups, each pixel group includes a plurality of pixel openings, and different quantum dots in the same pixel group emit the light of different colors. For example, when a pixel group includes three pixel openings, the three quantum dot light-emitting diodes in the pixel group may be a quantum dot light-emitting diode that emitting red light, a quantum dot light-emitting diode that emitting blue light, and a quantum dot light-emitting diode that emitting green light, respectively.

Finally, the present disclosure also provides a display panel, which may include the above display substrate. The display panel may further include a base substrate.

As shown in FIG. 7, the display panel may further include a pixel circuit array 32 disposed between the base substrate 31 and the plurality of light-emitting devices 33 for driving the plurality of light-emitting devices to emit light.

Further, the display panel further includes an encapsulation layer 34 for encapsulating the light-emitting devices 33, so as to insulate the light-emitting devices from moisture and oxygen. The light-emitting devices may include various types of light-emitting devices such as organic light-emitting device (OLED), or Mini light-emitting diode (Mini LED), etc.

The base substrate of the display panel may be a flexible base substrate, such as a polyimide base substrate, so that the display panel may be a flexible panel, which is not limited herein.

Therefore, the present disclosure provides a display panel, which includes a display substrate, wherein the display substrate is the above-described display substrate.

When the display substrate is a color film substrate, the display panel may further include an array substrate having light-emitting diodes, and the array substrate is disposed opposite to the display substrate as the color film substrate.

Alternatively, when the display substrate is a color film substrate, the display panel may further include an array substrate having a pixel circuit and a liquid crystal layer, the array substrate is disposed opposite to the display substrate as the color film substrate, and the liquid crystal layer is disposed between the array substrate and the display substrate. Accordingly, the display device including the display panel may further include a backlight source for providing a light source to the display panel.

When the display substrate includes a quantum dot light-emitting diode, the display panel may further include an encapsulation cover plate.

Embodiments of the present disclosure also provide a display device including the above display substrate. It should be noted that, the display device provided in the embodiments may be any product or component with a display function, such as a mobile phone, a tablet computer, a television, a display, a notebook computer, a digital photo frame, a navigator and the like. Other essential components of the display device are understood to be present by a skilled person in the art, and are not described herein nor should they be construed as limiting the present disclosure.

EXAMPLES

A method for manufacturing a display substrate as a color film substrate and a method for manufacturing a display substrate comprising quantum dot light-emitting diodes are respectively introduced as examples below.

Example 1

A black matrix (i.e., the pixel opening defining layer described above) is formed on a glass substrate using a photolithography method on a transparent glass for separating the red, green, and blue sub-pixels. The CdSe/ZnS quantum dot ink containing epoxy acrylic acid monomers is used. The initiator is 2,4-diethylacetophenone. The ligand is dodecyl mercaptan. The solvent is a mixture of ortho-dichlorobenzene and tetradecane with a volume ratio of 5:1. The quantum dots account for 8% by mass of the ink, and the monomer molecules account for 20% by mass of the ink.

The method comprises the steps of filling quantum dot ink into an ink box, sequentially printing red/green/blue inks into the middle of the black matrix by a printer, feeding the substrate into an exposure machine after printing, exposing the same through a mask by using 365 nm ultraviolet light after alignment, sending the substrate into a vacuum chamber upon exposure, fixing the film by vacuumizing to 10 mbar and removing the solvent, sending the film onto a hot plate after vacuumizing for 10 minutes, and annealing at 150° C. for 20 minutes to finish the preparation of the quantum dot color film.

Example 2

The CdSe/ZnS quantum dot ink containing methacrylate is used. The initiator is 4-phenyl benzophenone. The ligand is octyl mercaptan. The solvent is a mixture of ortho-dichlorobenzene and tetradecane with a volume ratio of 5:1. The quantum dots account for 8% by mass of the ink, and the monomer molecules account for 10% by mass of the ink.

A hole transport layer (using PEDOT material) and a hole injection layer (using TFB material) are printed on the ITO substrate by an ink jet printer. The method comprises the steps of filling quantum dot ink into an ink box, sequentially printing red/green/blue inks into the middle of the pixel opening by a printer, sending the substrate into an exposure machine after printing, exposing the same through a mask by using 365 nm ultraviolet light after alignment, sending the substrate into a vacuum chamber after exposing, fixing the film by vacuumizing to 10 mbar and removing the solvent, sending the film onto a hot plate after vacuumizing for 10 minutes, annealing at 150° C. for 20 minutes to finish the preparation of the quantum dot color film, then printing zinc oxide ink by a printer, and finally preparing electrode silver by evaporation to finish the preparation of the QLED device.

It will be understood that the above embodiments are merely exemplary embodiments employed to illustrate the principles of the present disclosure, and the present disclosure is not limited thereto. It will be apparent to a skilled person in the art that various changes and modifications can be made therein without departing from the spirit and scope of the disclosure, and these changes and modifications are to be considered within the scope of the disclosure.

What is claimed is:

1. A display substrate comprising a backing substrate and a pixel opening defining layer formed on the backing substrate, the pixel opening defining layer comprises a plurality of pixel openings, wherein the display substrate further comprises a quantum dot layer comprising a plurality of quantum dot units, the plurality of quantum dot units are located in the plurality of pixel openings respectively, wherein the quantum dot units comprise a matrix layer and quantum dots dispersed in the matrix layer, and the matrix layer comprises a central region and a peripheral region disposed around the central region, the peripheral region comprises a polymer of photocurable monomers, and the central region comprises the unpolymerized photocurable monomers.

2. The display substrate according to claim 1, wherein the matrix layer is formed of the photocurable monomers and the quantum dot units are formed by curing a curable ink comprising the photocurable monomers and the quantum dots.

3. The display substrate according to claim 1, wherein the quantum dot layer is used as a color conversion layer, the plurality of pixel openings are divided into a plurality of pixel unit groups, each pixel unit group comprises a plurality of the pixel openings, and the quantum dot units corresponding to the same pixel unit group have different light emission colors.

4. The display substrate according to claim 1, wherein the display substrate further comprises a first electrode layer and a second electrode layer, the quantum dot units are located between the first electrode layer and the second electrode layer, the first electrode layer comprises a plurality of first electrodes corresponding one-to-one to the plurality of pixel openings, the first electrode layer is located between the backing substrate and the pixel opening defining layer, and the second electrode layer is located on a side of the quantum dot layer away from the backing substrate.

5. The display substrate according to claim 1, wherein a mass ratio of the polymer of the photocurable monomers to the unpolymerized photocurable monomers in the peripheral region is greater than a mass ratio of the polymer of the photocurable monomers to the unpolymerized photocurable monomer in the central region.

6. The display substrate according to claim 2, wherein the curable ink comprises substantially 2% to 30% by mass of the quantum dots.

7. The display substrate according to claim 2, wherein the curable ink comprises substantially 5% to 50% by mass of the photocurable monomers.

8. The display substrate according to claim 1, wherein the photocurable monomers are selected from a group consisting of a radical-polymerizable photocurable monomer and a cationic-polymerizable photocurable monomer.

9. The display substrate according to claim 1, wherein the photocurable monomers are selected from at least one of epoxy acrylic acid, methacrylate, ethyl acrylamide, and ethyl ether acrylate.

10. The display substrate according to claim 1, wherein the mass ratio of the polymer of the photocurable monomers in the central region to the unpolymerized photocurable monomers in the central region is less than or equal to 1:10.

11. The display substrate according to claim 1, wherein the photocurable monomers are selected from at least one of a monomer having an epoxy group, a monomer having a vinyl ether group, a lactone-based monomer, an acetal-based monomer, and a cyclic ether-based monomer, and the ink further comprises a photoinitiator selected from at least one of a diazonium salt, a diaryliodonium salt, and a triarylsulfonium salt.

12. The display substrate according to claim 2, wherein the quantum dot layer is a color conversion layer, and in the curable ink, the quantum dots account for substantially 2% to 30% by mass of total amount of the curable ink, and the photocurable monomers account for substantially 5% to 50% by mass of total amount of the curable ink.

13. The display substrate according to claim 2, wherein the quantum dot layer is a light-emitting layer of quantum dot light-emitting diodes, and in the curable ink, the quantum dots account for substantially 2% to 15% by mass of total amount of the curable ink, and the photocurable monomers account for substantially 5% to 30% by mass of total amount of the curable ink.

14. A display panel comprising the display substrate according to claim 1.

15. The display panel according to claim 14, wherein the display substrate is a color film substrate, the display panel further comprises an array substrate having light-emitting diodes, the array substrate is disposed opposite to the display substrate as the color film substrate, and a liquid crystal layer is disposed between the array substrate and the display substrate.

16. The display panel according to claim 14, wherein the display substrate is a quantum dot light-emitting diode display substrate and the display substrate further comprises an encapsulation layer disposed on the quantum dot light-emitting diode display substrate.

17. A method for manufacturing a display substrate, comprising steps of:
providing an initial substrate having a pixel opening defining layer formed thereon, the pixel opening defining layer defines a plurality of pixel openings, and the pixel openings comprise a central region and a peripheral region disposed around the central region; and
performing at least one step of forming a final quantum dot layer, wherein the step of forming the final quantum dot layer comprises:
printing an ink into the pixel openings by ink jet printing to form an initial quantum dot layer, wherein the ink comprises: a solvent; and quantum dots and photocurable monomers dispersed in the solvent;
irradiating the ink in the peripheral region of at least one pixel opening to polymerize the photocurable monomers of the ink in the peripheral region of the at least one pixel opening; and
fixing the irradiated initial quantum dot layer to obtain the final quantum dot layer.

18. The manufacturing method according to claim 17, wherein the final quantum dot layer is a color conversion layer, and in the ink printed into the pixel openings, the quantum dots account for substantially 2% to 30% by mass of the ink, and the photocurable monomers account for substantially 5% to 50% by mass of the ink.

19. The manufacturing method of claim 17, wherein
the final quantum dot layer is a light-emitting layer of quantum dot light-emitting diodes, and in the ink printed into the pixel openings, the quantum dots account for substantially 2% to 15% by mass of the ink, and the photocurable monomers account for substantially 5% to 30% by mass of the ink, and
the step of providing the initial substrate comprises:
providing a backing substrate;
forming a first electrode layer, wherein the first electrode layer comprises a plurality of first electrodes corresponding one-to-one to the plurality of pixel openings; and
forming the pixel opening defining layer.

20. The manufacturing method according to claim 17, wherein the step of fixing the irradiated initial quantum dot layer comprises:
disposing the initial substrate upon subjecting to the irradiating in a vacuum chamber, and performing a vacuumizing operation; and
performing an annealing treatment on the initial substrate upon subjecting to the vacuumizing operation to obtain the final quantum dot layer.

* * * * *